US007943868B2

(12) United States Patent
Anders et al.

(10) Patent No.: US 7,943,868 B2
(45) Date of Patent: May 17, 2011

(54) SEALED HOUSING, A KIT OF PARTS INCLUDING AT LEAST ONE HOUSING, A COMBINATION INCLUDING THE HOUSING OR A KIT OF PARTS AND A USE OF A FRICTION ENHANCING ELEMENT

(75) Inventors: Herbert Anders, Dortmund (DE); Bernd Lindenbeck, Wuppertal (DE)

(73) Assignee: 3M Innovative Properties Company, St. Paul, MN (US)

( * ) Notice: Subject to any disclaimer, the term of this patent is extended or adjusted under 35 U.S.C. 154(b) by 296 days.

(21) Appl. No.: 12/299,137

(22) PCT Filed: Apr. 26, 2007

(86) PCT No.: PCT/US2007/067501

§ 371 (c)(1), (2), (4) Date: Oct. 31, 2008

(87) PCT Pub. No.: WO2007/143293

PCT Pub. Date: Dec. 13, 2007

(65) Prior Publication Data

US 2009/0255724 A1 Oct. 15, 2009

(30) Foreign Application Priority Data

May 2, 2006 (EP) .................................... 06009094

(51) Int. Cl.
*H01L 23/02* (2006.01)
*H05K 5/06* (2006.01)

(52) U.S. Cl. .................. 174/564; 455/575.7; 455/575.8

(58) Field of Classification Search .................. 257/733; 206/721; 174/367, 368, 564; 455/575.7, 455/575.8

See application file for complete search history.

(56) References Cited

U.S. PATENT DOCUMENTS

| | | | | |
|---|---|---|---|---|
| 3,190,092 | A | 6/1965 | Patriquin | |
| 4,394,679 | A * | 7/1983 | Hawrylo | 257/99 |
| 5,059,746 | A * | 10/1991 | Hayes et al. | 174/524 |
| 5,198,887 | A * | 3/1993 | Brown | 361/717 |
| 5,758,529 | A | 6/1998 | Chhatwal | |
| 6,298,699 | B1 | 10/2001 | Gartner et al. | |
| 6,822,161 | B2 * | 11/2004 | Komatsu et al. | 174/367 |
| 6,844,816 | B1 | 1/2005 | Melton et al. | |
| 2002/0036339 | A1 * | 3/2002 | Taguchi et al. | 257/690 |

(Continued)

FOREIGN PATENT DOCUMENTS

| | | | |
|---|---|---|---|
| DE | 91 09 018.0 | U1 | 1/1993 |
| DE | 299 16 092 | U1 | 3/2001 |
| EP | 0 557 861 | A1 | 9/1993 |
| EP | 0 848 122 | B1 | 12/1997 |

(Continued)

*Primary Examiner* — Hung V Ngo

(74) *Attorney, Agent, or Firm* — Janet A. Kling

(57) ABSTRACT

A sealed housing (10) accommodates at least one electric or electronic component (12, 14), and has a portion (20) extending through the mounting surface, as well as a rotation preventor (16, 28) preventing rotation of the housing (10) relative to the mounting surface. A kit of parts includes at least one such housing (10) and at least one spacer (18). A combination of the housing or kit of parts and a door, preferably of a cabinet or an installation room, or a cabinet in the field of telecommunications having the mounting surface is described. A use of a friction enhancing element, preferably an O-ring, for mounting a housing to a mounting surface in a non-rotatable manner is also described.

17 Claims, 3 Drawing Sheets

U.S. PATENT DOCUMENTS

| | | | | |
|---|---|---|---|---|
| 2003/0056557 | A1 | 3/2003 | Squier | |
| 2004/0041705 | A1 | 3/2004 | Auerbach et al. | |
| 2006/0007899 | A1 | 1/2006 | White | |
| 2009/0283320 | A1 * | 11/2009 | Twitchell et al. | 174/560 |

FOREIGN PATENT DOCUMENTS

| | | | |
|---|---|---|---|
| WO | WO 2005/071193 | A1 | 8/2005 |
| WO | WO 2005/093192 | | 10/2005 |

* cited by examiner

SEALED HOUSING, A KIT OF PARTS INCLUDING AT LEAST ONE HOUSING, A COMBINATION INCLUDING THE HOUSING OR A KIT OF PARTS AND A USE OF A FRICTION ENHANCING ELEMENT

CROSS REFERENCE TO RELATED APPLICATIONS

This application is a national stage filing under 35 U.S.C. 371 of PCT/US2007/067501, filed 26 Apr. 2007, which claims priority to European Patent Application No. 06009094.1, filed 2 May 2006, the disclosure of which is incorporated by reference in its/their entirety herein.

TECHNICAL FIELD

The invention relates to access control means for cabinets and housings for telecommunication equipment, particularly to a sealed housing, a kit of parts including at least one housing, a combination including the housing or kit of parts and a use of a friction enhancing element.

BACKGROUND

In various technical fields, a variety of objects or installations are accommodated in rooms or cabinets that may be closed with a door. It is often desirable to control access to such rooms or cabinets, and in such situations it may prove insufficient to lock the door with a mechanical lock. It is possible, for example, for a person not authorized to access the room or cabinet to gain possession of a key to the mechanical lock. For this reason electronic locks are sometimes used, since unauthorized access can be prevented more easily, or at least be monitored to know who and when a protected area is accessed. An electronic lock can, for example, be connected to a centralized security system and there monitored for unauthorized access.

In the field of telecommunications, numerous customers are connected with the switch of a telecommunications company via telecommunications lines. Customers are also sometimes referred to as subscribers. The switch is also often called an exchange or “PBX” (central office exchange operated by the telecommunications company). Between the subscriber and the switch, sections of telecommunications lines are connected with telecommunications modules. Telecommunications modules establish an electrical connection between a first wire attached to the telecommunications module at a first side and a second wire attached to the telecommunications module at a second side. The wires of one side can also be called incoming wires and the wires of the other side can be called outgoing wires. Plural telecommunications modules can be put together at a distribution point, such as a main distribution frame, an intermediate distribution frame, an outside cabinet or a distribution point located, for example, in an office building or on a particular floor of an office building. To allow flexibility in wiring, some telecommunications lines are connected with first telecommunications modules in a manner to constitute a permanent connection. Such a distribution point can be accommodated in a designated room or cabinet located either inside or outside a building, and it may be protected by an electronic lock as described above. Moreover, distribution points can be accommodated in manholes, i.e. underground holes that can be adapted to allow an individual to climb into the hole and provided with a cover that may include an electronic lock. The electronic lock may include an antenna, a transponder or a similar electric or electronic component attached to a door or other outside surface of the protected room or cabinet.

European Patent Publication No. 0 848 122 A1 describes an actuator for a lock of a cabinet that may comprise a chip for carrying a code and a reader system fittable in the region of the actuator for reading the code.

U.S. Pat. No. 5,758,529 is related to a housing for externally mounting an electronic lock to a support structure. The electronic lock may be accommodated in a generally cylindrical bore, and the front face of the lock coincides with the housing rear face.

SUMMARY OF THE INVENTION

The present invention provides sealed housings that accommodate at least one electric or electronic component that can be mounted to a mounting surface in a particularly secure manner. The sealed housings of the invention generally have a portion extending through a mounting surface as well as a rotation preventor means that retards or prevents rotation of the housing relative to the mounting surface.

In another aspect, the invention provides a kit of parts including at least one such housing. The kit of parts described herein includes at least one such housing and at least one spacer.

In yet another aspect, the invention provides a combination of the housing or kit of parts with a door of a cabinet or a room, which combination leads to enhanced security of the room or cabinet. In one such embodiment, the combination includes the housing or kit of parts and a door (preferably of a cabinet or an installation/equipment room) in the field of telecommunications.

In a further aspect, the invention provides a friction enhancing element for securely mounting a housing to a mounting surface in a generally non-rotatable manner. In at least some embodiments, the friction enhancing element is preferably an O-ring.

BRIEF DESCRIPTION OF THE DRAWINGS

The invention will be described hereinafter in part by reference to non-limiting examples thereof and with reference to the drawings, in which.

DETAILED DESCRIPTION OF PREFERRED EMBODIMENTS

Figure 1:
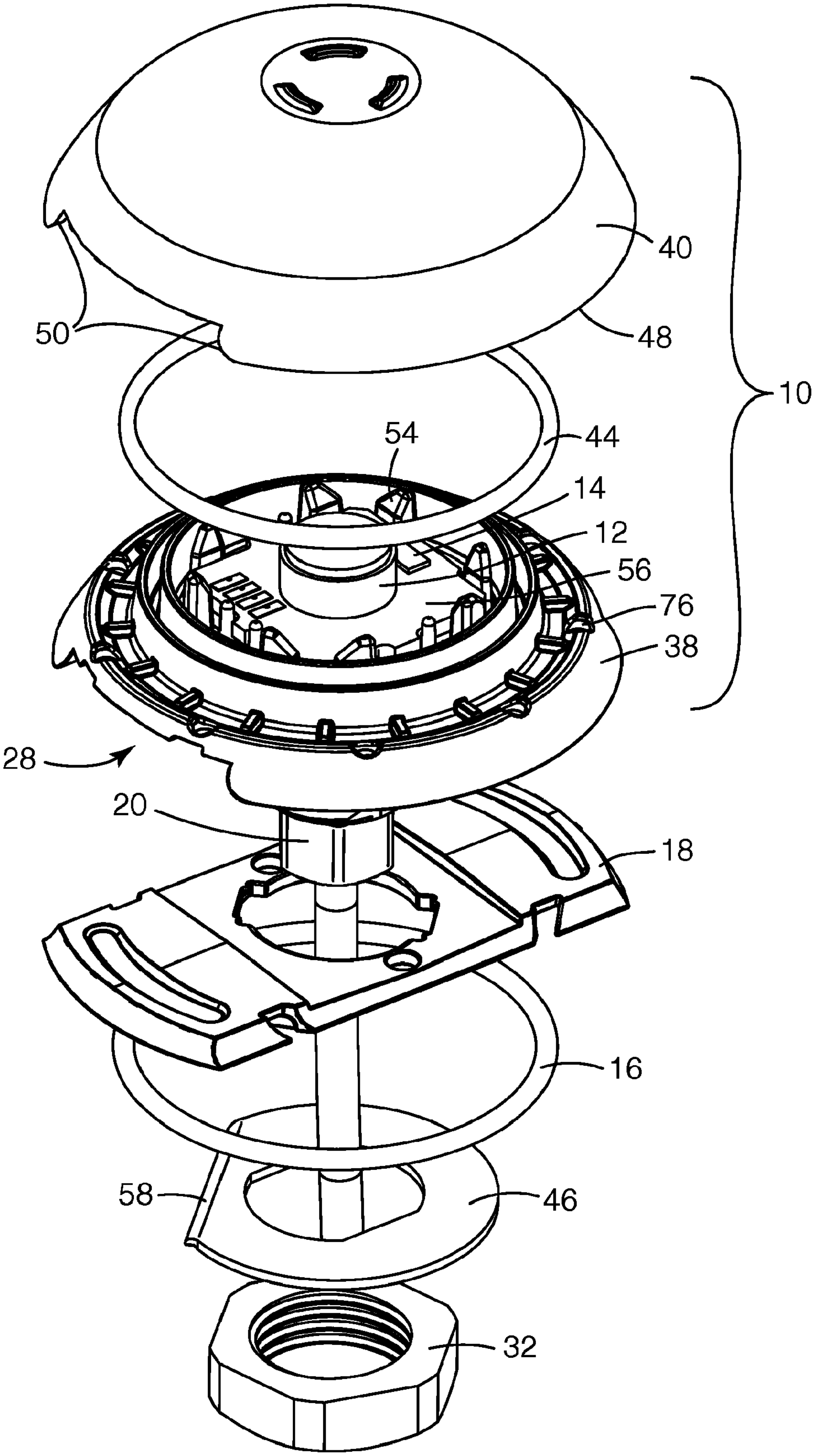
FIG. 1 shows an exploded view of a housing according to an embodiment of the invention.

The housings described herein are generally sealed and accommodate at least one electric or electronic component. The housing may include one or more housing parts such as a cover and base plate. The housing parts may be made of a moldable plastic material, and in at least some embodiments at least a portion of the housing parts are made of a translucent plastic material. The material of the housing parts may be resistant against aggressive substances. The housing is generally sealed to protect the electric or electronic components contained within it. Such sealing can provide protection against a water spray (corresponding to IP 54 protection), or against water supplied by a hose (corresponding to IP 65 protection). By using a seal of appropriate material, such as a graphite-containing material, a seal may additionally be provided against aggressive substances like gasoline or oil which may be present in an outside environment where the housing may reside in use when, for example, it is mounted to an outside cabinet.

The electric or electronic components contained within the housing can be active, passive, or both active and passive. An antenna, which may be connected to an electronic lock or other electronic module within the cabinet, can be contained inside the housing. Thus, the invention makes it possible to mount an antenna on the outside surface of a cabinet, an installation/equipment room, an underground vault, closures, terminals, distribution hubs and the like in a well-protected manner. The housing may also be retrofitted to existing cabinets, installation rooms or other infrastructure element described above, including in the doors of the pre-existing cabinets. The housings of the invention may also be mounted to a desired object on-site. As will be described in more detail below, a single hole can be made through the mounting surface to allow the housing to be mounted. The hole may be made by known processes such as by punching, drilling and the like. It is advantageous to consider drilling circular holes since these are easy to drill. After drilling the hole, the prepared housing from which one or more cables connected with the components contained within the housing may extend can be mounted by inserting one or more cables and a portion of the housing through the hole and fixing the housing appropriately.

Thus, the housing generally has a portion extending through the mounting surface. This portion may have a substantially circular cross-section, may be provided with one or more flats around its parameter and may include a thread adapted to interact with a nut. The nut can be tightened to attach the housing by clamping the mounting surface between the housing and the nut. The portion extending through the mounting surface may include a guide and/or a seal that may surround one or more cables leading to the area inside or behind the mounting surface.

The housing also generally has a rotation prevention mechanism that can hinder or stop rotation of the housing relative to the mounting surface. This rotation prevention mechanism, or rotation preventor, can be any contour, structure, separate element or combination of elements capable of hindering or stopping rotation of the housing relative to the mounting surface. Some examples are given below. The rotation prevention mechanism may be adapted to completely prevent rotation of the housing relative to the mounting surface, or it can be adapted to sufficiently hinder rotation or stop rotation within a certain range with regard to the rotation angle. This may be sufficient for achieving the desired effects as detailed below. The rotation prevention mechanism provides the advantage of enhancing the long-term reliability of the housing and the electric or electronic components contained within it. For example, when one or more cables extending from the housing are connected with an electronic lock, the rotation prevention mechanism hinders or stops the housing and, as a consequence, prevents the cables from being twisted, which could destroy the electrical connections. Thus, a well-protected and reliable attachment of one or more electric or electronic components to a mounting surface may be achieved by the housings of the invention. The rotation preventor may also comprise means for preventing rotation of the housing relative to the mounting surface. These means may particularly be provided on the mounting surface, on the housing and/or between the housing and the mounting surface without extending through the mounting surface. When a housing includes only a single portion extending through the mounting surface, rotation cannot be prevented by interaction between this portion and the edges of a hole through which the portion extends. The inclusion of a rotation prevention mechanism has been shown to preclude rotation of the housing relative to the mounting surface.

The rotation prevention mechanism may be a friction enhancing element, allowing the housing to be mounted to a substantially flat mounting surface with the friction enhancing element providing sufficient friction between the housing and the mounting surface to prevent rotation. The housing may have a single portion extending through a hole in the mounting surface which may be larger in diameter than the portion and/or the portion may be circular in cross-section so that rotation cannot be prevented by interaction between the portion extending through the mounting surface and the edges of the hole. Surprisingly, it has been found that a friction enhancing element, which may be clamped between the housing and the mounting surface provides sufficient rotation resistance of the housing relative to the mounting surface through a frictional contact force.

It may be advantageous to use an O-ring as the friction enhancing element; as an O-ring is a standard and inexpensive piece and allows the described effects to be achieved.

The rotation prevention mechanism may also comprise or contain at least one step or groove formed in the housing that corresponds to a similar feature in the mounting surface. As will be described in more detail below, the housing may be attached to a mounting surface having one or more raised strips formed thereon. Such a raised strip may have flanks that interact with at least one step formed on the housing to prevent rotation. At least one groove may also be provided to accommodate the raised strip and prevent rotation of the housing relative to the mounting surface. Alternatively, the housing may be designed such that it is mountable on mounting surfaces having other surface features such as channels, v-shaped ridges, and the like.

The housings of the invention can be employed in connection with an electronic lock, which implies that the electronic component accommodated in the housing may include an antenna adapted to receive authorization information from a transponder or similar device. Thus, the housing may advantageously be used in a security system to prevent unauthorized access to rooms, cabinets or similar areas.

It may also prove advantageous that a person receive a confirmation signal after sending the authorization information to the electronic component such as an antenna. The confirmation signal may comprise an optical or acoustic signal, or both. Such a signal may confirm authorization by sending out a light signal or sending out a light signal having a different color than in a situation when authorization is denied.

This can be realized by providing at least one optical signaling device, such as an LED, in the housing in a manner that is visible from outside. This may be achieved by making at least a portion of the housing translucent enough to allow an optical signaling device contained inside the housing to be externally viewable. The housing may be made of two or more different materials, such as from a first a translucent material and a second opaque material. In the manufacturing process of the housing the portion of the housing made of a first material can be produced first and can thereafter be combined with the second material by injection molding "around" the first material. The portion made of the first, opaque material may have an opening that is subsequently filled with a translucent material to provide a window or viewing hole to allow an optical signaling device to be viewed from outside the housing.

The housings of the invention may additionally provide a substantially shock-proof accommodation of the one or more electronic or electric components by including at least one damper. It may, furthermore, provide enhanced protection against tampering or any attempts to destroy or remove the housing from the mounting surface. The housing may have a shape that substantially avoids corners or edges that could be used to engage a tool if an attempt to remove or destroy the housing is made. Thus, the housing may have an at least partially spherical, dome, or bowl shape.

The housing may include at least one base plate and at least one cover. The cover may be attachable to the base plate in an attachment direction. This construction of the housing may be advantageous for assembling the housing and accommodating the electronic or electric components by putting these onto the base plate and closing the housing by attaching the cover thereafter.

Additional rotation protection between cover and base plate may be provided by attaching the cover to the base plate in a non-rotatable manner. Moreover, when the position of an optical signaling device, such as an LED, relative to the base plate is fixed, the non-rotatable attachment of the cover to the base plate may ensure that the optical signaling device is reliably visible through a translucent portion in the cover and that the cover is securely attached to the base.

It may be advantageous to fix the base plate and the cover to each other by plastic deformation of at least one portion, such as at least one protrusion of the base plate and/or the cover. The other housing part, i.e., the cover or the base plate, may include one or more through holes or recesses into which the portion that is to be deformed is inserted. The deformation may be carried out by ultrasonic welding or an application of heat and/or pressure and may be considered a riveting process that deforms the mentioned portions to prevent these from leaving the through holes or recesses. As a result, the cover and the base plate are attached to each other.

When the cover is attached to the base plate in an attachment direction, it may be advantageous to provide a seal, such as an O-ring, between the base plate and the cover by a force acting in a direction different from the attachment direction. In this manner, the force generated by the seal in reaction to the holding force does not act in the attachment direction and does not, therefore, endanger the reliable attachment of the cover to the base plate.

It may also be advantageous to provide electrostatic discharge (ESD)-protection to prevent unintended damage to the electronic components contained within the housing. This may be accomplished when the cover and the base plate are made of an isolating material to provide such protection. A sealing element such as an O-ring made of silicone may also be used for this purpose. Alternatively, when a more conventional sealing element such as a graphite containing O-ring is used a maze is formed between the base plate and the cover to provide isolation between the interior and the exterior of the housing. Such a maze may be formed by one or more ridges, webs or projections. This increases the distance a spark produced outside the housing would have to travel to reach the inside of the housing. An alternative embodiment may comprise a different kind of O-ring, e.g., an O-ring made of Silicone or unfilled rubber.

The invention may be provided as a kit of parts that can be used to retrofit existing cabinets or installation rooms, in particular cabinet or room doors. The kit of parts may be mounted to the desired object easily on site in the field. The kits may include at least one housing and at least one spacer. The spacer may be used to make a housing that is compatible with a flat mounting surface. This may be achieved by placing the spacer in a groove formed in the housing, the groove being adapted to accommodate the raised strip of the mounting surface. The spacer may also be used as a drilling template to define a proper location for drilling a hole through which a portion of the housing can extend. The spacer may have at least one hole denoting a drilling location for drilling a hole for allowing the portion of the housing to pass through. In this case, the spacer may be used as a drilling template. It is noted that the spacer described herein, including one or more of the features described above or below and/or in one or more of the embodiments of the spacer of the invention, is to be considered subject matter of the application also without the housing described herein.

To render the spacer compatible with different mounting situations, the spacer may have at least one portion defining the above-mentioned hole, the portion being removable from the spacer. As a consequence, the spacer can be used as a drilling template and can, moreover, be used as a spacer for mounting the housing to a flat mounting surface when the portion including the hole is removed so that the portion of the housing extending through the mounting surface would also extend through the hole of the spacer.

It may be furthermore advantageous when the housing has a groove adapted to accommodate the spacer in a manner to locate outer contours of the spacer substantially flush with outer contours of the housing. In this case, the combination of the housing and the spacer substantially avoids any steps, gaps, edges or corners, which could be used to engage a tool.

The invention further provides a kit of parts including at least one housing and a drilling template. As described above with regard to the spacer, the drilling template may have at least one hole denoting a drilling location for drilling a hole for allowing the portion of the housing to pass through. With such a kit of parts, reliable mounting of the housing can be achieved.

The kit of parts may further include at least one fastener adapted to cooperate with the portion extending through the mounting surface to secure the housing. In particular, the mounting surface can be clamped between the housing and a fastener (e.g., a nut) by tightening the fastener.

Whereas the housing or the kit of parts described herein may be used to retrofit a cabinet or an installation room, for example by retrofitting a door, the invention also provides a combination of the housing or kit and a door, preferably of a cabinet or an installation room. With this combination, a door of an installation room or a cabinet can be provided with a well-protected electronic or electric component on the outside, for example, in the case where the electronic or electric component includes an electronic lock.

Tampering with or any other attempts to remove or destroy the housing from the mounting surface can be efficiently prevented when the housings of the invention are installed flush with the mounting surface around the perimeter of the housing.

The invention finally provides a use of a friction enhancing element, such as an O-ring, for mounting a housing to a mounting surface in a non-rotatable manner. In this context, the invention prevents rotation of the housing relative to the mounting surface by clamping the friction enhancing element by a force increasing the friction sufficiently to prevent rotation.

Figure 6:
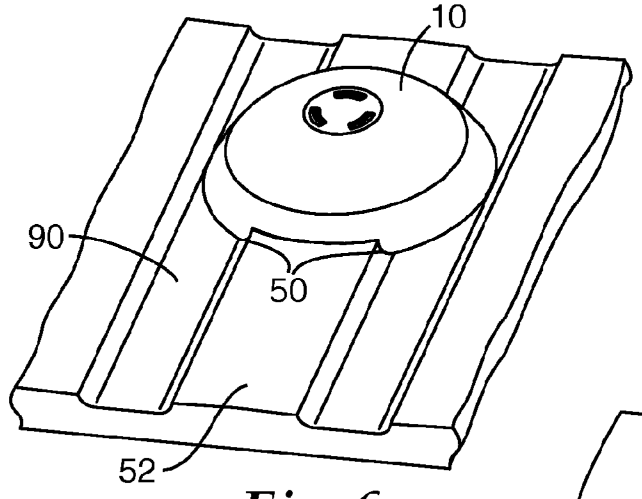
FIG. 6 shows a perspective view of a housing according to an embodiment of the present invention in a mounted state.
Figure 7:
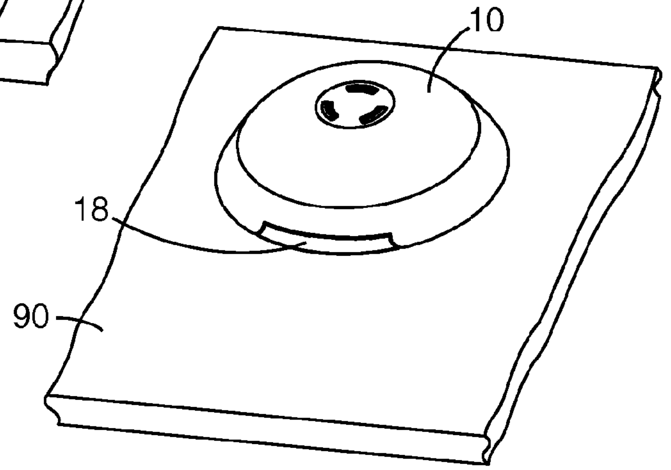
FIG. 7 shows a perspective view of the kit of parts of one of FIG. 1 to 3 in the mounted state.

Turning now to FIG. 1, which is an exploded view of a kit of parts consisting of a sealed housing 10 having a base plate 38 and a cover 40. As will additionally be apparent from FIGS. 2 and 3, the cover 40 may be dome-shaped and may lack any edges or corners. This may be advantageous for preventing an engagement by a suitable tool, which may be a heavy-duty tool that could be used to destroy or remove the cover 40 and/or the complete housing 10 by violence from the mounting surface 90. In particular, the lower edge 48 of the cover 40 is adapted to be flush with the mounting surface 90 as shown in FIGS. 6 and 7. In one embodiment as shown in FIG. 1, the lower edge 48 of the cover 40 may be provided with two steps 50 which may correspond to a groove (not visible in FIG. 1) formed on that side of the base plate 38 which is adapted to face and mate with a corresponding feature of the mounting surface 90. As can be seen in FIG. 6, the groove may be adapted to receive a raised strip 52 formed on the mounting surface 90. Thus, the groove may serve as a rotation preventor hindering or halting rotation of the housing 10 relative to the mounting surface 90. In an alternative embodiment the lower edge 48 may be unbroken such that it may be mounted to a flat mounting surface using a friction enhancing element without the need for a spacer. It is additionally within the scope of this invention to provide an alternately shaped spacer which would allow the use of a housing having an unbroken edge to adapt to a cover having an unbroken edge to be mounted on a non-flat mounting surface. In this instance the friction enhancing element would be located between the spacer and the housing.

The kit of parts may include a spacer 18 adapted to fit into groove 28 formed in the base plate 38. The use of this spacer 18 renders the embodiment of FIG. 1 compatible also with flat mounting surfaces 90 as shown in FIG. 7 (i.e., where the mounting surface lacks one or more raised strips 52 as shown in FIG. 6). In both situations, shown in FIG. 6 and 7 (i.e., the housing being mounted to a mounting surface 90 having one or more raised strips 52 without the spacer 18 and mounted to a flat mounting surface 90 together with spacer 18) the edges of the cover 40 and/or the spacer 18 are flush with the mounting surface 90. This may provide the advantage that also in the mounted state, there are substantially no gaps and/or free edges, which could be used to engage a suitable tool therewith to attempt to remove or destroy the housing by violence from the mounting surface 90.

As can be seen in FIG. 1, the base plate 38 may include various pins 54 which may serve at least one of the following purposes. Firstly, internal twist protection can be provided such that rotation of the cover 40 relative to the base plate 38 is prevented by engaging one or more detents, tabs or similar structures provided on the cover (not visible in FIG. 1) with one or more pins 54 provided on the base plate. Secondly, one or more pins 54 may provide coding for one or more printed circuit boards 56 which may be inserted in the interior of the base plate 38. In other words, one or more edges of the printed circuit board can have a specific contour (i.e. a combination of recesses, projections, steps or the like which need to correspond to one or more pins 54 provided in the base plate 38 to be able to insert the printed circuit board 56 appropriately). In this context, the printed circuit board 56 may be substantially rectangular or square. Those pins 54, which are used for providing the above-described twist protection, may be present near the corners of the printed circuit board, and those pins 54, which provide the above-described coding, may be present along one or more edges of the printed circuit board.

As can be seen in FIG. 1, the printed circuit board 56 may carry one or more electronic or electric devices, such as an antenna 12 and/or an LED 14. The antenna 12 may be used as a component of an electronic lock or security monitoring system. For example, an electronic lock (not shown in the figures) may be configured to receive access information sent to the antenna 12 from outside the housing 10 by a suitable transponder or a similar device. The suitable access information may be used in the electronic lock to unlock and/or allow the unlocking of a mechanical lock. Moreover, the access information may be sent to a central security system to collect data about any accesses that have occurred, and to check if they were authorized. Alternatively, access information or maintenance information may be collected on-site by an appropriate transponder or other external device. The above-described LED 14 may be used to indicate to a person handling a transponder or a similar device outside the housing that (depending on the color of the emitted light) an authorization to access the room or cabinet protected by the electronic lock is authorized or not. As an alternative, the LED may be lit, when access is granted or when the electronic lock has been released. The LED 14 may also be lit to indicate that a signal has been sent to the system via the antenna even without indicating whether or not access has been given. As can be seen in more detail in FIG. 2 and 3, a gasket, such as an O-ring 44 shown in FIG. 1, may be provided between the base plate 38 and the cover 40 to prevent water spray from entering the housing 10 and/or to provide electrostatic-discharge protection.

As indicated above, spacer 18 shown in FIG. 1 is adapted to be accommodated in the groove 28 formed in the base plate 38 for specific applications of the kit of parts shown in FIGS. 1 and 7. In particular, when the housing 10 is to be mounted to a flat mounting surface 90, i.e. when the groove 28 cannot cooperate with a raised strip 52 (see FIG. 6) of a mounting surface 90 to prevent rotation of the housing, an alternative rotation preventor may be employed. In the case of FIG. 1, a friction enhancing element, such as an O-ring 16 shown in FIG. 1 may be used to prevent rotation of the housing 10 relative to the mounting surface 90. For this purpose, the O-ring 16 may be present and clamped between the housing 10 and/or the spacer 18 and the mounting surface 90 as shown in more detail in FIG. 2. In particular, the housing 10 may have a portion 20 extending through the mounting surface 90. This portion 20 may have a thread which may interact with a fastener, such as a nut 32, to clamp the housing 10 to the mounting surface 90. Finally, FIG. 1 shows a washer 46 having at least one bent portion 58 which may prevent the nut 32 from being turned relative to the portion 20 which could lead to a loosening of the housing 10 from the mounting surface 90.

Figure 2:
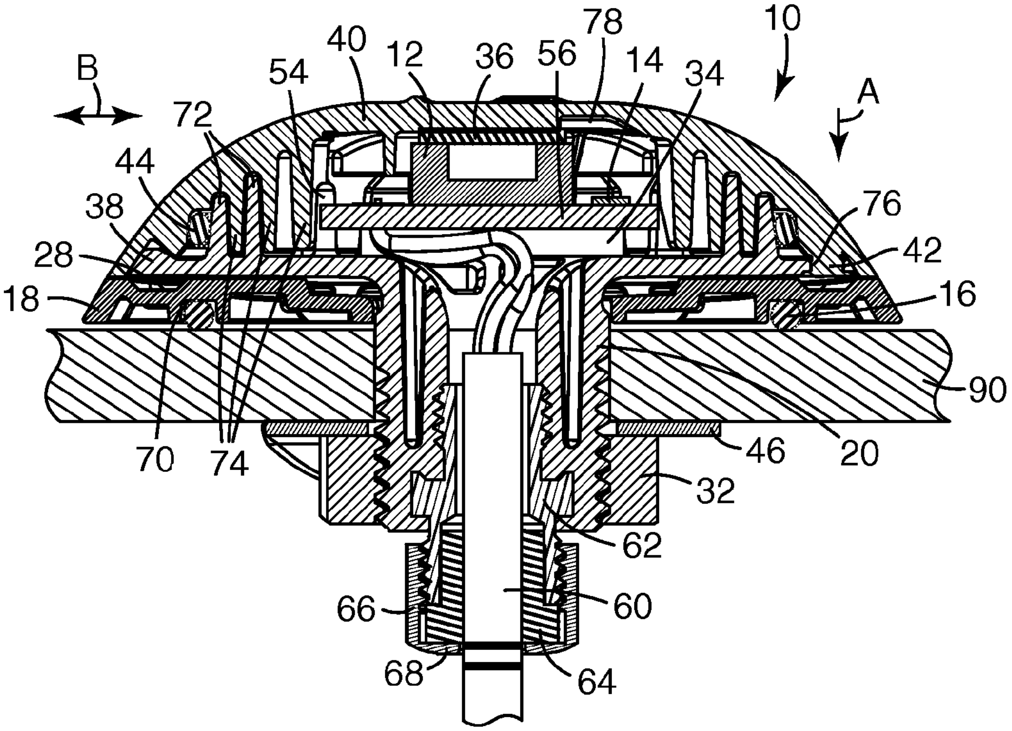
FIG. 2 shows a sectional view of the housing of FIG. 1 in the mounted state.

FIG. 2 is a sectional view of the housing of FIG. 1 attached to a mounting surface 90. In the mounted state, the mounting surface 90 is accommodated between the washer 46 and the friction enhancement O-ring 16. The nut 32 may have an internal thread which cooperates with an external thread of the portion 20 of the housing 10 which extends through the mounting surface 90. The nut 32 may be applied tightly to apply a pulling force between the washer 46 and the O-ring 16 which will be counteracted by the mounting surface 90 positioned in between so that the O-ring 16 will be clamped and may be deformed, thereby causing sufficient friction against rotation of the housing 10 relative to the mounting surface 90 to substantially prevent or at least hinder or retard rotation.

FIG. 2 additionally shows a cable 60 connected with printed circuit board 56. The cable 60 may lead to an electronic lock inside or behind a door or inside a cabinet protected by the lock or to other electronic components within the cabinet which are part of a security monitoring system. As can be seen in FIG. 2, the cable may be led through a guide 62 which may be present inside portion 20. The guide 62 may be of the same or a different material than portion 20 and may or may not be formed integrally with portion 20. A seal or gasket 64 may be present around the cable 60 and within the guide 62, and a seal nut 66 (that may have a portion 68 at least partially covering the seal 64 in a radial direction) may be screwed onto guide 62. This may clamp the gasket 64 in an axial direction and expand the gasket 64 in a radial direction to provide a reliable seal around cable 60.

FIG. 2 also shows the spacer 18 accommodated in the groove 28 of the base plate 38. The spacer 18 may have a groove 70 in which the friction enhancement O-ring 16 may be accommodated. FIG. 2 further shows pins 54 that may be used to provide coding for printed circuit boards 56 such that only a printed circuit board with a suitable coding contour on at least one of the edges thereof can be inserted. FIG. 2 also shows a damper 34 underneath the printed circuit board 56. The damper 34 may be provided in the form of one or more strips of damping material which may provide a vibration damping effect. A further damper 36 may be provided between the antenna 12 and the inside surface of the cover 40. The damper 36 may be provided in a circular or other suitable shape. In the case of a circular shape, it will generally correspond to the circular shape of the antenna 12 as shown for the embodiment of FIG. 1.

The inventive housing may be equipped with ESD protection to isolate internal electronic components from potentially damaging ESD events that may occur outside the housing. Isolation can be achieved by having the housing and sealing means of the housing made of isolating materials.

As shown in FIG. 2, the base plate 38 may have one or more annular or circular webs or ridges 72 which cooperate with one or more complementary ridges 74 formed on the cover 40 to form a maze. Such a maze may provide ESD (Electro Static Discharge)-protection as a spark that may be produced by a high voltage outside the housing will have to travel through the maze, i.e., up and down along the ridges 72, 74 to reach the electronic components such as the antenna 12 inside. Experiments show that this can prevent the electronic components inside from being affected by high voltages produced outside the housing.

In this context, it can be mentioned that the maze formed by ridges 72, 74 allows the use of conventional O-rings 44 containing graphite, which tend to be more durable than O-rings that do not contain graphite but which would otherwise not meet the criteria for an isolating sealing member. The durability of the sealing member is important because the housings may be employed on the outside of outdoor cabinets, e.g., cabinets located near streets or similar surroundings, where aggressive substances such as gasoline or oil may be present and affect durability of the O-ring. As mentioned, this durability can be ensured by an O-ring containing graphite, and ESD-protection may be accomplished by the maze.

The maze formed by complementary ridges 72, 74 may, apart from electrostatic discharge protection, additionally provide protection against water spray. In particular, the housing can thus be protected based on standard IP 54 (spray) or IP 65 (hose-proof).

Finally, the ridges 72, 74 may be formed to be in tight contact with each other in the attached state of the cover 40 to provide additional mechanical stability to the housing.

FIG. 2 also shows a preferred type of connection between the base plate 38 and the cover 40. In this case, the base plate 38 has one or more openings 76, into which one or more protrusions 42 provided on the cover 40 may be inserted and deformed, e.g., by ultrasonic welding application of heat or pressure, etc., to provide an engagement between the base plate 38 and the cover 40.

The interaction between the appropriately deformed protrusions 42 and the opening 76 can be called a rivet fastening.

As can be seen in FIG. 2, the O-ring 44 between the base plate 38 and the cover 40 may be held by a force acting in direction B between one of the ridges 72 formed on the base plate and an opposing ridge 74 formed on the cover 40. This direction B may be different than the direction in which the cover 40 is attached to the base plate 38 by inserting one or more protrusions 42, as shown FIG. 2, into one or more openings 76. This measure, i.e., the O-ring 44 being held by a force acting in a direction B different from the attachment direction A (which in the case shown is substantially perpendicular to direction B), may provide the advantage that the O-ring can be clamped without causing a reaction force of the O-ring tending to loosen the attachment or exerting a substantial force on the protrusions used to secure the cover to the base.

As can be seen in FIG. 2, the cover 40 can be provided with an integral lens or viewing window 78 to make the LED 14 visible from the outside. For this purpose, the material of the cover 40 can be somewhat thinner to be translucent in the region of the viewing window 78 to make the LED 14 visible from the outside. As an alternative, as shown in more detail in FIG. 3, two different materials can be used for the cover 140. An inner part of the cover 40 that may include one or more ridges 74 and one or more protrusions 42 may be substantially transparent or having an opacity which allows the LED 14 to be viewed through it. An outer part of the cover 40 having a viewing window 78 filled with material of the inner part may be non-transparent or having a high opacity. Thus, from the outside, one can merely view the area underneath the viewing window 78 to find out whether the LED indicates an authorized access. It is noted that the structure of the cover shown in FIG. 3 can be used for the embodiment of FIG. 2 and vice versa.

Specific positions of the protrusions 42 may be used to provide a type of coding between the base plate 38 and the cover 40. In other words, it may be ensured by specific positions of the protrusions 42 and corresponding positions of the through holes 76 that the base plate 38 and the cover 40 are attached to each other in a specific orientation. In particular, the above-mentioned plural coding systems may ensure that the LED 14 positioned on the printed circuit board 56 is reliably positioned underneath the viewing window 78 so that it can reliably be viewed from outside. This may be achieved by using one or more pins 54 provided on the base plate 38 to determine a specific position of the printed circuit board including the LED provided relative to the base plate 38. By the coding system related to the attachment of the cover 40 to the base plate 38 (i.e., the protrusions 42 and the through holes 76) a specific position of the cover including the viewing window 78 may be ensured to position the viewing window 78 above LED 14 to make the LED 14 visible from the outside, at least when it is emitting a light signal. The specific coding methods described above are provided for illustrative purposes. It will be understood that other coding methods may also be employed with equal effect, and therefore will also be encompassed within the scope of the invention. For example, coding can also be accomplished by choosing a particular shape of the pins 54 etc.

Figure 3:
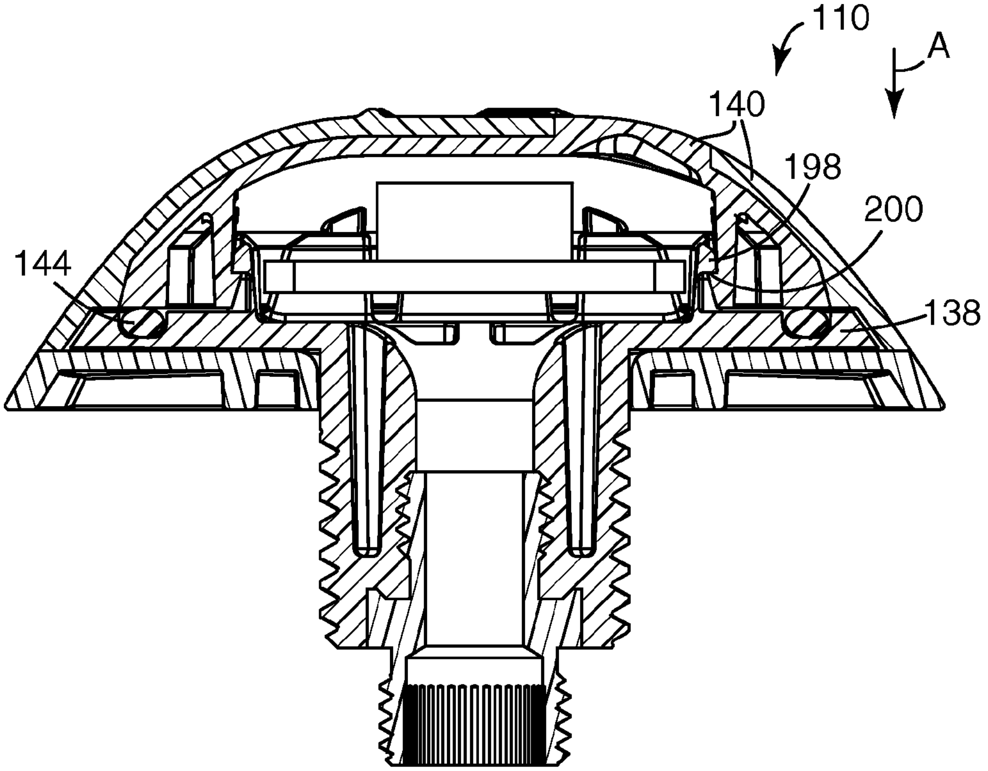
FIG. 3 shows a sectional view of a housing according to a further embodiment of the invention.

FIG. 3 shows a second embodiment of the housing 110 that is similar to the embodiment of FIG. 1 so that the explanations will focus on the differences vis-à-vis the embodiment of FIG. 1. In particular, in the embodiment of FIG. 3, the cover 140 is connected with the base plate 138 by one or more latch hooks 198. The base plate 138 may include one or more latch hooks 198 extending substantially in a direction towards the cover 140. To provide latch engagement, the latch hooks 198 have a hook-type end or a step having a locking surface 200 facing the base plate 138. The cover 140 may have one or more corresponding latch hooks having locking surfaces adapted to cooperate with the locking surfaces 200 of the latch hooks 198 of the base plate 138. Thus, when the cover 140 is attached to the base plate 138 by moving the cover in direction A, at least portions of the latch hooks will be slightly deformed, bent or displaced sideways to allow the complementary latch hook to pass. Due to elasticity of the latch hooks, they will return to their original position and shape after the corresponding latch hook has passed to bring the locking surface into engagement and preventing the cover from moving opposite to direction A which would remove the cover from the base plate. In the embodiment of FIG. 3, O-ring 144 may be clamped between the base plate 138 and the cover 140 by a force acting in direction A. However, the O-ring 144 may also be clamped in a direction different from direction A, e.g. in direction B, as shown in FIG. 2, to avoid deterioration due to the clamping force acting on the latch hooks 198 securing the cover 140. The further details of the embodiment of FIG. 3 substantially correspond to those of the embodiment of FIG. 1 and do not need to be repeated here. The structure of the cover 140, an opaque outer part and a translucent inner shell, which may be formed by insert molding, co-injection molding or by assembling two separate parts was described above with reference to FIG. 2. As mentioned above, all of the above-described embodiments may be used together with a spacer 18.

Figure 4:
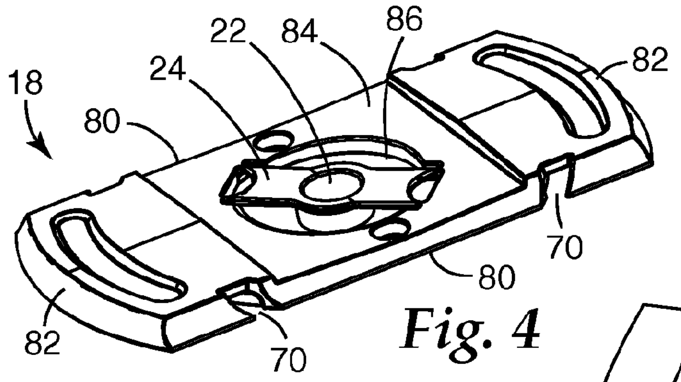
FIG. 4 shows a perspective view of a spacer of the housing shown in one of FIG. 1 to 3 before mounting same.

FIG. 4 shows the spacer 18 in a perspective view. The spacer 18 substantially has the shape of a flat strip and may have two straight edges 80 corresponding to straight edges of the groove 28 that may be formed in the base plate 38. Corresponding to the round shape of the cover 40, the remaining edges 82 of the spacer may be rounded to fully conform to the edges of the cover 40 and provide the assembly of cover 40 and spacer 18 with a uniform, round edge. Moreover, corresponding to the dome-shaped form of the cover 40, 140, the rounded edges 82 of the spacer 18 may be inclined or somewhat curved along the thickness (as seen in direction A) of the spacer 18. FIG. 4 also shows the groove 70 provided in the spacer 18 for accommodating the friction enhancing O-ring 16.

Figure 5:
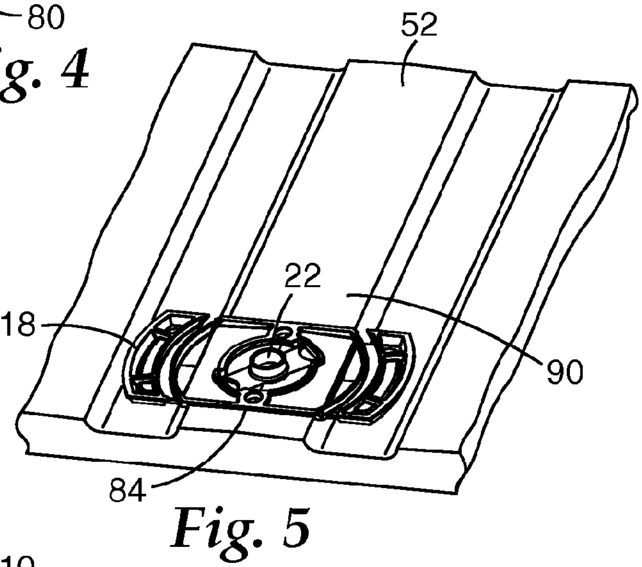
FIG. 5 shows a perspective view of the spacer of FIG. 4 used in connection with a profiled mounting surface.

In the embodiment of FIG. 4, the spacer 18 can also be used as a drilling template. As mentioned above, the housing 10 may be attached to mounting surfaces 90, such as those of cabinets, having one or more raised strips 52 (see FIG. 6). In this case, a hole may be provided in the mounting surface 90 for allowing the portion 20 of the housing 10 to extend through the mounting surface 90. To ensure that the housing 10 is positioned appropriately, i.e., with steps 50 (see FIG. 1) accommodating the raised strip 52 (see FIG. 6), the spacer 18 may be used to define the proper drilling location. For this purpose, the spacer 18 may have a groove 84 that can be relatively wide and flat across one of the surfaces of the spacer 18. In particular, the groove 84 may correspond to the raised strip 52 of the mounting surface 90 so that the spacer can be positioned as shown in FIG. 5 with the groove 84 accommodating the raised strip 52. The spacer 18 may further have at least one hole 22 denoting a drilling location to allow the drilling of a hole in a location that allows the portion 20 of the housing 10 to pass through the hole formed in the mounting surface 90 and, at the same time, allow the positioning of the housing 10 relative to the raised strip 52, with the raised strip 52 accommodated between steps 50 (see FIG. 1) of the cover 40. It is noted that the raised strip 52 does not necessarily need to have the cross-sectional configuration with a flat top as shown in the figures. It may have any other cross-sectional configuration, such as a convex, curved shape, a roof-like shape, a concave top or any other configuration. It is apparent that the complementary contours formed on the housing can be adapted to the shape of the strip.

As can be further seen in FIG. 4, the hole 22 of the spacer may be formed on a removable portion 24 having the shape of an attached strip that is removable with respect to the remainder of the spacer 18. In the embodiment shown in FIG. 1, the spacer 18 may, firstly, be used as a drilling template as described above. As shown in FIG, 6, the housing 10 can in this case be attached to the mounting surface 90 without the spacer 18. Secondly, the spacer, as shown in FIG. 4, may be used as a spacer that is mounted to a mounting surface 90 together with the housing 10. In this case, the removable portion 24 is removed to allow the portion 20 of the housing to pass through the central hole 86 now formed in the spacer 18. Thus, with this combination of housing 10 and spacer 18, as shown in FIG. 4, a high versatility can be achieved, as the housing may be mounted to different types of mounting surfaces 90, i.e., with or without the raised strips 52.

As mentioned, FIG. 5 shows the use of the spacer 18 as a drilling template. As compared to the orientation of FIG. 4, the spacer 18 has been turned upside down with groove 84 accommodating the raised strip 52 formed on the mounting surfaces 90. The hole 22 denotes the location for drilling a hole through which the portion 20 (see FIG. 1) of the housing 10 extending through the mounting surface 90 can pass.

FIG. 6 shows the mounted state of the housing 10 with steps 50 and a groove formed in the housing defined by steps 50 accommodating the raised strip 52. By interaction between the steps 50 and the raised strip 52, rotation of the housing 10 relative to the mounting surface 90 is prevented.

Finally, FIG. 7 shows the housing 10 mounted to a substantially flat mounting surface 90. The embodiment shown in the mounted state in FIG. 7 may be used in combination with the spacer shown in FIG. 4. By this combination the housing including the spacer 18 presents a uniform and smooth surface without any substantial steps, gaps, edges or corners so that an engagement by tools that may be used to make an attempt to remove or destroy the housing is substantially prevented. Moreover, although it cannot be seen in FIG. 7, the friction enhancement O-ring 16 (see FIG. 1 to 3) is clamped between the housing 10 and the mounting surface 90 and may provide sufficient friction to prevent the housing 10 from being rotated or twisted relative to the mounting surface 90.

The present invention has now been described with reference to several individual embodiments. The foregoing detailed description has been given for clarity of understanding only. No unnecessary limitations are to be understood or taken from it. All references to right, left, front, rear, up and down as well as references to directions are exemplary only and do not limit the claimed invention. It will be apparent to those persons skilled in the art that many changes can be made in the embodiments described without departing from the scope of the invention. Thus, the scope of the present invention should not be limited to the details and structures described herein, but rather by the structures described by the language of the claims, and the equivalents of those structures.

The invention claimed is:

1. A sealed housing to provide access control to a telecommunication cabinet, the sealed housing comprising:

a base plate and a cover wherein the cover is attachable to the base plate such that the base plate fits within the cover when the cover is attached to the base;

an antenna disposed between the base plate and the cover;

a portion extending from the base plate opposite the cover, wherein the portion is adapted to extend through a mounting surface of the telecommunication cabinet, wherein a portion of a lower edge of the cover is flush with a mounting surface of the telecommunication cabinet when the housing is installed;

a cable connected to the antenna passing through the portion adapted to extend through the mounting surface of the telecommunication cabinet;

and a rotation preventor preventing rotation of the sealed housing relative to the mounting surface.

2. The sealed housing in accordance with claim 1, wherein the rotation preventor is a friction enhancing element.

3. The sealed housing in accordance with claim 2, wherein the friction enhancing element is an O-ring wherein the friction enhancing members allows the mounting of the sealed housing to a mounting surface in a non-rotatable manner.

4. The sealed housing in accordance with claim 1, wherein the rotation preventor is at least one step or at least one groove.

5. The sealed housing in accordance with claim 4, wherein the step or groove is adapted to accommodate at least one of a web, a step, or a ridge formed on the mounting surface.

6. The sealed housing in accordance with claim 1, wherein the sealed housing further comprises at least one optical signaling device.

7. The sealed housing in accordance with claim 1, wherein the sealed housing includes at least one damper extending from the base plate for holding the at least one electric or electronic component.

8. The sealed housing in accordance with claim 1, wherein the sealed housing has one of a partially spherical, dome or bowl shape.

9. The sealed housing in accordance with claim 1, wherein the cover is attachable to the base plate in an attachment direction (A).

10. The sealed housing in accordance with claim 9, wherein the base plate and the cover are fixed to each other by plastic deformation of at least one portion of the base plate and the cover.

11. The sealed housing in accordance with claim 9, wherein a seal is held between the base plate and the cover by a force acting in a direction (B) different than the attachment direction (A).

12. A kit of parts including at least one sealed housing in accordance with claim 1 and at least one spacer.

13. The kit of parts in accordance with claim 12, wherein the spacer has at least one hole denoting a drilling location for drilling a hole for allowing the portion of the sealed housing to pass through.

14. The kit of parts in accordance with claim 12, further including at least one fastener adapted to cooperate with the portion extending through the mounting surface of a telecommunication cabinet to secure the sealed housing thereto.

15. The sealed housing in accordance with claim 1, wherein the mounting surface of the telecommunication equipment cabinet is a door and wherein the sealed housing is mounted in the door of the telecommunication equipment cabinet.

16. The sealed housing of claim 15, wherein the sealed housing is, around its perimeter, installed flush with the mounting surface.

17. The sealed housing in accordance with claim 1, further comprising a maze formed between the base plate and cover.

* * * * *

UNITED STATES PATENT AND TRADEMARK OFFICE
CERTIFICATE OF CORRECTION

PATENT NO. : 7,943,868 B2
APPLICATION NO. : 12/299137
DATED : May 17, 2011
INVENTOR(S) : Herbert Anders et al.

It is certified that error appears in the above-identified patent and that said Letters Patent is hereby corrected as shown below:

<u>Column 13,</u>
Line 29, delete "or" and insert -- and -- therefor.

Signed and Sealed this
Twentieth Day of September, 2011

David J. Kappos
*Director of the United States Patent and Trademark Office*